US009305829B2

(12) United States Patent
Myung et al.

(10) Patent No.: US 9,305,829 B2
(45) Date of Patent: Apr. 5, 2016

(54) SEMICONDUCTOR PACKAGE WITH AN INDENTED PORTION AND MANUFACTURING METHOD THEREOF

(71) Applicant: SAMSUNG ELECTRO-MECHANICS CO., LTD., Suwon (KR)

(72) Inventors: Jun Woo Myung, Suwon (KR); Sung Min Song, Suwon (KR)

(73) Assignee: SAMSUNG ELECTRO-MECHANICS CO., LTD., Suwon (KR)

( * ) Notice: Subject to any disclaimer, the term of this patent is extended or adjusted under 35 U.S.C. 154(b) by 0 days.

(21) Appl. No.: 14/501,592

(22) Filed: Sep. 30, 2014

(65) Prior Publication Data

US 2015/0179552 A1   Jun. 25, 2015

(30) Foreign Application Priority Data

Dec. 24, 2013   (KR) .......... 10-2013-0162640

(51) Int. Cl.
| | |
|---|---|
| H01L 23/495 | (2006.01) |
| H01L 23/28 | (2006.01) |
| H01L 23/12 | (2006.01) |
| H01L 23/34 | (2006.01) |
| H01L 21/56 | (2006.01) |
| H01L 21/768 | (2006.01) |
| H01L 23/13 | (2006.01) |
| H01L 23/433 | (2006.01) |
| H01L 23/31 | (2006.01) |

(52) U.S. Cl.
CPC ........ *H01L 21/76802* (2013.01); *H01L 21/565* (2013.01); *H01L 23/12* (2013.01); *H01L 23/13* (2013.01); *H01L 23/4334* (2013.01); *H01L 23/49531* (2013.01); *H01L 23/49575* (2013.01); *H01L 23/3107* (2013.01); *H01L 2224/48091* (2013.01); *H01L 2224/48137* (2013.01); *H01L 2224/48247* (2013.01); *H01L 2924/13055* (2013.01)

(58) Field of Classification Search
CPC ....... H01L 23/495; H01L 23/28; H01L 23/12; H01L 23/34; H01L 21/565; H01L 21/76802
USPC ......... 257/666, 773, 774, 675, 691, 692, 693, 257/696, 698, 784, 786
See application file for complete search history.

(56) References Cited

U.S. PATENT DOCUMENTS

| | | | | |
|---|---|---|---|---|
| 5,948,991 | A | * | 9/1999 | Nomura et al. ................. 73/727 |
| 6,548,328 | B1 | * | 4/2003 | Sakamoto et al. ............ 438/121 |
| 7,701,048 | B2 | | 4/2010 | Lee et al. |
| 2003/0087538 | A1 | * | 5/2003 | Ueno ............................... 439/68 |
| 2004/0217472 | A1 | * | 11/2004 | Aisenbrey et al. ............ 257/734 |

(Continued)

FOREIGN PATENT DOCUMENTS

| | | |
|---|---|---|
| JP | 5-235073 | 9/1993 |
| JP | 2001-24012 | 1/2001 |

*Primary Examiner* — Alexander Oscar Williams

(57) ABSTRACT

A semiconductor package includes a substrate, at least one electronic device, a lead frame, and a molded portion. The substrate has at least one indented portion formed as a groove therein. The electronic device is mounted on one surface of the substrate. The lead frame is bonded to the substrate and electrically connected to the electronic device. The molded portion seals the lead frame and the electronic device and includes at least one through hole extending the indented portion.

14 Claims, 8 Drawing Sheets

(56) References Cited

U.S. PATENT DOCUMENTS

| | | | |
|---|---|---|---|
| 2008/0087459 A1* | 4/2008 | Das et al. | 174/260 |
| 2009/0152714 A1* | 6/2009 | Yamagishi et al. | 257/724 |
| 2010/0091464 A1* | 4/2010 | Ohnishi et al. | 361/723 |
| 2010/0127387 A1* | 5/2010 | Soda et al. | 257/706 |
| 2010/0133684 A1* | 6/2010 | Oka et al. | 257/712 |
| 2010/0193822 A1* | 8/2010 | Inobe et al. | 257/98 |
| 2013/0181225 A1* | 7/2013 | Oka et al. | 257/76 |
| 2013/0256711 A1* | 10/2013 | Joo et al. | 257/88 |
| 2014/0332951 A1* | 11/2014 | Nakamura et al. | 257/712 |

* cited by examiner

SEMICONDUCTOR PACKAGE WITH AN INDENTED PORTION AND MANUFACTURING METHOD THEREOF

CROSS-REFERENCE TO RELATED APPLICATION

This application claims the benefit of Korean Patent Application No. 10-2013-0162640 filed on Dec. 24, 2013, with the Korean Intellectual Property Office, the disclosure of which is incorporated herein by reference.

BACKGROUND

The present disclosure relates to a semiconductor package and a manufacturing method thereof, and more particularly, to a semiconductor package and a manufacturing method thereof where an exposed surface of a substrate is prevented from being covered by a molded portion.

In accordance with the development of the power electronics industry, using power devices such as power transistors, insulated-gate bipolar transistors (IGBTs), metal oxide semiconductor (MOS) transistors, silicon-controlled rectifiers (SCR), power rectifiers, servo drivers, power regulators, inverters, or converters, the demand for power products having excellent performance and capable of being lightened and miniaturized has increased.

In accordance with the above-mentioned trend, research into a technology of integrating various power devices in a single package and attempting to manufacture the power devices and a control device for controlling the power devices in the single package has recently been actively undertaken.

A power semiconductor package according to the related art is configured to generally include a lead frame, a power device mounted on the lead frame, and a molded portion forming exteriors of respective devices using a resin, or the like. In addition, the power semiconductor package includes a heat dissipating substrate to effectively discharge heat.

However, in the above-mentioned semiconductor package according to the related art, there are cases in which one surface of the heat dissipating substrate is not clearly exposed to the outside and a portion of the molded portion covers the heat dissipating substrate due to deformation, such that the heat dissipating substrate may be bent during a process of manufacturing the semiconductor package.

An exterior of the semiconductor package of the above-mentioned cases may be defective, and heat dissipating effects may also be degraded. Therefore, a semiconductor package capable of clearly exposing one surface of the heat dissipating substrate to an exterior of the molded portion and a manufacturing method thereof are required.

RELATED ART DOCUMENT (Patent Document 1) Japanese Patent Laid-Open Publication No. 1993-235073

SUMMARY

An exemplary embodiment in the present disclosure may provide a semiconductor package manufacturing method capable of clearly exposing outer surface of a heat dissipating substrate to an exterior of a molded portion.

According to an exemplary embodiment in the present disclosure, a semiconductor package may include: a substrate having at least one indented portion formed as a groove therein; at least one electronic device mounted on one surface of the substrate; a lead frame bonded to the substrate and electrically connected to the electronic device; and a molded portion sealing the lead frame and the electronic device and including at least one through hole extending the indented portion.

The substrate may have the indented portion formed in one surface thereof and the other surface exposed to an exterior of the molded portion.

The semiconductor package may further include an insulating layer interposed between the substrate and the electronic device.

The insulating layer may be formed of a ceramic material.

The indented portion may be formed in a thickness direction of the substrate.

The indented portion may be formed as a groove having the same cross sectional area.

The indented portion may be formed as a groove having a cross sectional area decreased toward one end thereof.

The molded portion may have a portion thereof partially formed in the indented portion.

According to an exemplary embodiment in the present disclosure, a semiconductor package may include: a substrate having at least one indented portion formed in one surface thereof; an insulating layer stacked on one surface of the substrate; a wiring pattern formed on the insulating layer; at least one electronic device mounted on the wiring pattern; and a molded portion sealing the electronic device and including at least one through hole exposing the indented portion to the outside.

According to an exemplary embodiment in the present disclosure, a manufacturing method of a semiconductor package may include: preparing a substrate; forming an indented portion in one surface of the substrate; mounting an electronic device on one surface of the substrate; and pressing the indented portion in a mold and forming a molded portion.

The forming of the molded portion may include: allowing a pressing pin included in the mold to be in contact with the indented portion and pressing the substrate; and injecting a molding resin into the mold.

The forming of the indented portion may include: forming at least one indented portion in a groove shape in one surface of the substrate; forming an insulating layer on one surface of the substrate; and forming a wiring pattern on the insulating layer.

In the forming of the insulating layer, the insulating layer may be formed of a ceramic material.

The forming of the molded portion may include partially forming the molded portion in the indented portion formed in the groove shape.

BRIEF DESCRIPTION OF THE DRAWINGS

The above and other aspects, features and other advantages in the present disclosure will be more clearly understood from the following detailed description taken in conjunction with the accompanying drawings, in which.

DETAILED DESCRIPTION

Figure 1:
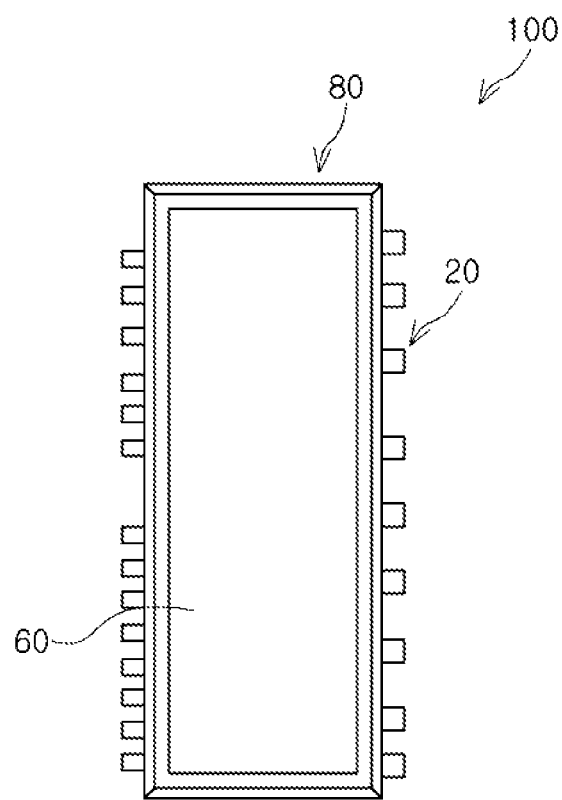
FIG. 1 is a plan view schematically illustrating a semiconductor package according to an exemplary embodiment in the present disclosure.

Hereinafter, embodiments of the present disclosure will be described in detail with reference to the accompanying drawings.

The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Figure 2:
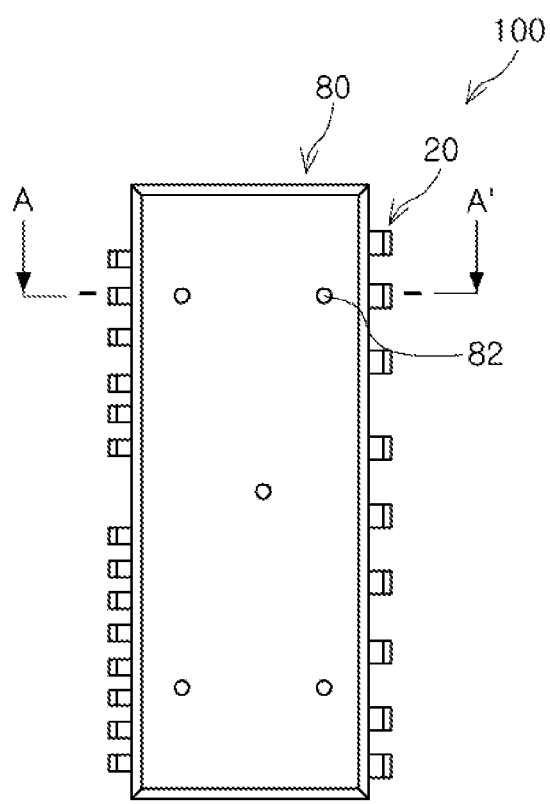
FIG. 2 is a bottom view of FIG. 1.
Figure 3:
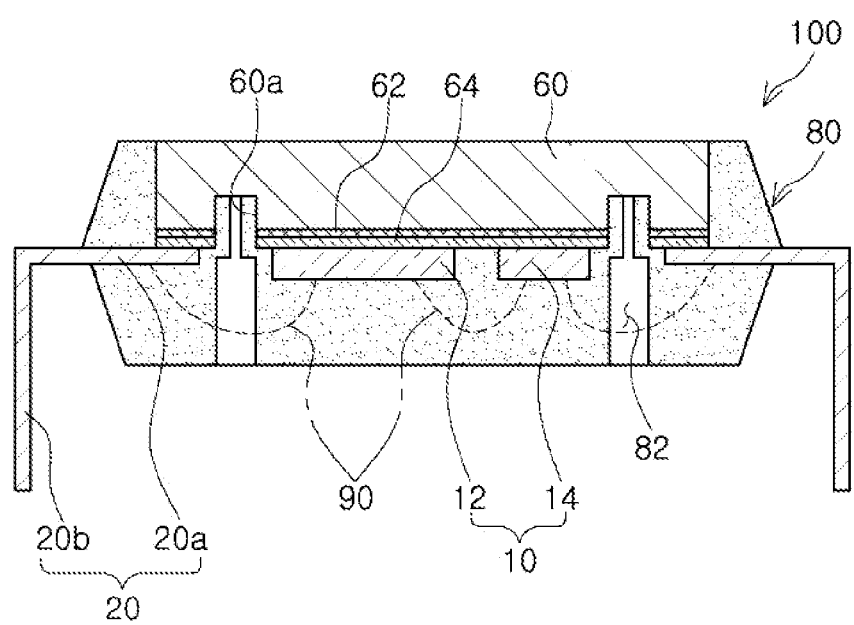
FIG. 3 is a cross-sectional view taken along line A-A of FIG. 2.

FIG. 1 is a plan view schematically illustrating a semiconductor package according to an exemplary embodiment in the present disclosure, FIG. 2 is a bottom view of FIG. 1, and FIG. 3 is a cross-sectional view taken along line A-A of FIG. 2.

Referring to FIGS. 1 through 3, a semiconductor package 100 according to the present exemplary embodiment may be configured to include an electronic device 10, a lead frame 20, a substrate 60, and a molded portion 80.

The electronic device 10 may include various devices such as passive devices, active devices, and the like. Particularly, the electronic device 10 according to the present exemplary embodiment may include at least one first electronic device 12 (e.g., a power device) and at least one second electronic device 14 (e.g., a control device).

Here, the power device 12, which is the first electronic device 12, may be a power converting device for a power control or a power circuit device for a power control such as a servo deriver, an inverter, a power regulator, a converter, and the like.

For example, the power device 12 may be a power metal oxide semiconductor field effect transistor (MOSFET), a bipolar junction transistor (BJT), an insulated gate bipolar transistor (IGBT), a diode, or may include a combination thereof. That is, in the present exemplary embodiment, the power device 12 may include all or some of the above-mentioned devices.

In addition, the power device 12 may include the IGBT and the diode. In addition, a total of six pairs of power device packages may be implemented, wherein each pair includes the IGBT and the diode. However, the above-mentioned structure is only an example, and the present disclosure is not necessarily limited thereto.

The power device 12 may be attached to one surface of a substrate 60 to be described below through an adhesive member (not shown). Here, the adhesive member may be conductive or non-conductive. For example, as the adhesive member, pastes such as a solder, a metal epoxy, a metal paste, a resin-based epoxy, and the like may be cured to be used.

The control device 14 may be electrically connected to the power device 12 through a bonding wire 90, and may control an operation of the power device 12, accordingly. The control device 14 may be, for example, a microprocessor. In addition, the control device 14 may be a passive device such as a resistor, an inverter, or a condenser, or active devices such as a transistor.

Meanwhile, one control device 14 or a plurality of control devices 14 may be disposed with respect to one power device 12. That is, the kind and the number of control devices 14 may be appropriately selected depending on the kind and the number of power devices 12.

As such, the semiconductor package 100 according to the present exemplary embodiment may be a power module including the power device 12 and the control device 14 controlling the power device 12.

In addition, in the present exemplary embodiment, the power device 12 and the control device 14 are not disposed in a shape in which they are vertically stacked, but are horizontally disposed. Accordingly, the semiconductor package 100 may be formed in a shape having a horizontal length (i.e., width) longer than a vertical length (i.e., thickness).

The lead frame 20 may be configured to include a plurality of leads, where the respective leads may be classified into a plurality of outer leads 20b connected to an external substrate (e.g., mother board: not shown) and a plurality of inner leads 20a connected to the electronic device 10. That is, the outer lead 20b may refer to a portion exposed to an exterior of the molded portion 80 and the inner lead 20a may refer to a portion disposed in the molded portion 80.

The substrate 60 may be a printed circuit board (PCB), a ceramic substrate, a pre-molded substrate, a direct bonded copper (DBC) substrate, or a conductive substrate provided by the lead frame.

Particularly, the substrate 60 according to the present exemplary embodiment, which is a heat dissipating substrate discharging heat generated from the electronic device 10 to the outside, may be an insulated metal substrate (IMS) on which an insulating layer 62 is formed.

The electronic device 10 and the inner lead 20a of the lead frame 20 may be bonded onto one surface of the substrate 60. In addition, the other surface of the substrate 60 may be exposed to the exterior of the molded portion 80 to be described below.

In addition, one surface of the substrate 60 may be provided with the insulating layer 62 and a wiring pattern 64.

The insulating layer 62 may insulate between the substrate 60 and the wiring pattern 64. Therefore, as a material of the insulating layer 62, various materials may be used as long as it may insulate between the substrate 60 and the wiring pattern 64. Particularly, the insulating layer 62 according to the present exemplary embodiment may be formed of a ceramic material.

The above-mentioned insulating layer 62 may be formed by applying an insulating material on one surface of the substrate 60 in a spray scheme or a squeeze scheme. However, the present disclosure is not limited thereto.

The wiring pattern 64 may be formed by a typical layer forming method, for example, a chemical vapor deposition (CVD) method or a physical vapor deposition (PVD) method. Alternatively, the wiring pattern 64 may be formed by an electroplating method, an electroless plating method, a compressing method, or the like.

In addition, the wiring pattern 64 may include a conductive material such as a metal. For example, the wiring pattern 64 may include aluminium, an aluminium alloy, copper, a copper alloy, or a combination thereof.

The electronic devices 10 and the lead frame 20 may be mounted on the wiring pattern 64. In addition, the electronic devices 10 and the lead frame 20 may be electrically connected to each other through the wiring pattern 64 or the bonding wire 90.

Meanwhile, although the present exemplary embodiment illustrates a case in which the electronic devices 10 are electrically connected to the lead frame 20 through the bonding wire 90, a configuration of the present disclosure is not limited thereto. That is, the electronic devices 10 may be connected to the wiring pattern 64 through the bonding wire 90.

In addition, the electronic devices 10 may be electrically connected to the wiring pattern 64 directly. In this case, various methods may be used. For example, the electronic device 10 and the substrate 60 may be electrically connected to each other in a flip chip bonding scheme or using a solder ball.

The bonding wire 90 according to the present exemplary embodiment may be formed of a metal material, for example, aluminium (Al), gold (Au), or an alloy thereof. In addition, in order to bond the bonding wire 90 to the electronic devices 10 and the wiring pattern, the electronic devices 10 and the wring pattern 64 may respectively include a connecting part (not shown) such as a typical connecting pad.

In addition, the substrate 60 according to the present exemplary embodiment may have at least one indented portion 60a formed thereon.

The indented portion 60a may be formed in one surface of the substrate 60 which is buried by the molded portion 80 and may be formed as a groove in which it is formed to a predetermined depth in a vertical direction (a thickness direction) of the substrate 60.

One or multiple indented portions 60a may be formed and the indented portion 60a may be formed to have a groove having a cylindrical shape.

The present exemplary embodiment illustrates a case in which a plurality of indented portions 60a are respectively disposed on both ends of the substrate 60 in the length direction and a middle portion thereof, by way of example. However, the present disclosure is not limited to the above-mentioned configuration, but may be variously applied as in other exemplary embodiment to be described below.

In addition, the indented portion 60a may be formed in a shape in which it penetrates through the insulating layer 62 and the wiring pattern 64. Therefore, in the case in which the wiring pattern 64 is not formed on the corresponding portion, the indented portion 60a may be formed in a shape in which it penetrates through only the insulating layer 62.

The molded portion 80 may be partially formed in the indented portion 60a. In the case in which the molded portion 80 is partially formed in the indented portion 60a as described above, the molded portion 80 and the substrate 60 may be more firmly coupled to each other, whereby a phenomenon that the substrate 60 is delaminated from the molded portion 80 may be significantly decreased.

The molded portion 80 may expose the other surface of the substrate 60 and may seal the substrate 60, the power device 12, the control device 14, and a portion (i.e., inner lead) of the lead frame 20.

The molded portion 80 may have a shape in which it covers and seals the electronic devices 10 and the inner lead 20a of the lead frame 20 bonded to the substrate 60, such that it may protect the electronic devices 10 from an external environment. In addition, the molded portion may fix the electronic devices 10 while enclosing the electronic devices 10 from an exterior of the electronic devices 10, such that it may safely protect the electronic devices 10 from external impact.

The molded portion 80 may be formed to expose the other surface of the substrate 60 to the outside. Therefore, the molded portion 80 may be formed in a shape in which it buries a portion of the substrate 60 rather than the entire substrate 60.

In addition, the molded portion 80 according to the present exemplary embodiment may include at least one through hole 82 extending the indented portion 60a of the substrate 60 as described above. The through hole 82 may be formed as a hole having a shape corresponding to positions and shapes of the indented portions 60a of the substrate 60. That is, the through hole 82 may be formed to have the same diameter or cross-section as that of the indented portion 60a. However, the present disclosure is not limited thereto. In addition, similar to the indented portion 60a of the substrate 60, the through hole 82 may be formed to penetrate through the molded portion 80 in the vertical direction of the substrate 60.

The through hole 82 may be formed in a portion in which the lead frame 20 is not present or may be formed in a shape in which it penetrates through the lead frame 20.

By the through hole 82 and the indented portion 60a of the substrate 60, an interior of the indented portion 60a of the substrate 60 may be exposed to the outside, that is, in the air partially through the through hole 82.

The above-mentioned molded portion 80 may be formed of an insulating material. Particularly, as a material of the molded portion 80, a material such as silicone gel having high thermal conductivity, thermally conductive epoxy, polyimide, or the like, may be used.

Meanwhile, although not illustrated, a heat sink (not shown) may be fastened on an outer surface of the molded portion 80, particularly, the other surface of the substrate 60 in order to effectively discharge heat. The heat sink may be disposed to be fully exposed to an exterior of the semiconductor package 100 and may be attached to the other surface of the substrate by a high temperature tape, a high temperature solder, or the like.

As such, the semiconductor package 100 according to the present exemplary embodiment expands an exposed area of the substrate 60 exposed to the outside by the indented portion 60a formed in the substrate 60, whereby the heat dissipating effect may be increased.

In addition, since the molded portion 80 is partially filled in the indented portion 60a formed in the substrate 60, the substrate 60 and the molded portion 80 may be very firmly coupled. Therefore, even in the case in which much heat is generated due to an operation of the semiconductor package 100, a phenomenon that the substrate 60 and the molded portion 80 are delaminated from each other due to heat deformation may be prevented.

Next, a manufacturing method of a semiconductor package 100 according to an exemplary embodiment in the present disclosure will be described.

FIGS. 4A through 4G are views for describing a manufacturing method of a semiconductor package according to an exemplary embodiment in the present disclosure.

Figure 4A:
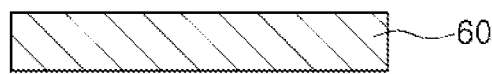
FIGS. 4A through 4G are views for describing a manufacturing method of a semiconductor package according to an exemplary embodiment in the present disclosure.

First, as shown in FIG. 4A, a substrate 60 is prepared. Here, the substrate 60 may be a metal substrate 60 as described above.

Figure 4B:
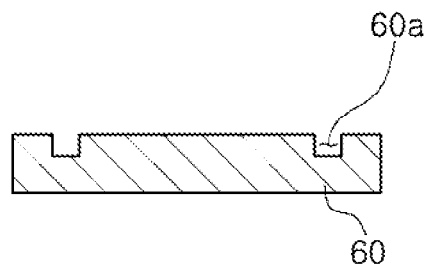

Next, as shown in FIG. 4B, an indented portion 60a having a groove shape may be formed in the metal substrate 60. The indented portion 60a may be formed using a chemical processing method such as an etching, or the like, or a mechanical processing method such as a laser drill.

Figure 4C:
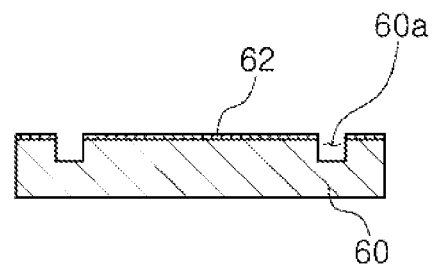

Next, as shown in FIG. 4C, an insulating layer 62 may be formed in one surface of the substrate 60. The insulating layer 62 according to the present exemplary embodiment may be formed by performing a masking process for the indented portion 60a of the substrate 60, applying an insulating material on one surface of the substrate 60 as a whole, and then removing the masking.

Here, as the insulating material, a ceramic based material may be used. In addition, the insulating material may be formed in one surface of the substrate 60 by a spray method or a squeeze method.

Meanwhile, although the present exemplary embodiment illustrates a case in which the indented portion 60a is first formed and the insulating layer 62 is then formed, by way of example, the configuration of the present disclosure is not limited thereto. For example, the configuration of the present disclosure may be variously applied, as needed. For example, the insulating layer 62 may be first formed in one surface of the substrate 60, the insulating layer 62 and the substrate 60 may be removed together by the laser drill, or the like, the indented portion 60a may be then formed, and so forth.

Figure 4D:
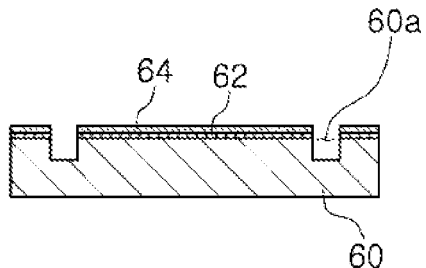

Next, as shown in FIG. 4D, a wiring pattern 64 having conductivity may be formed on the insulating layer 62. The wiring pattern 64 may be formed by a chemical vapor deposition (CVD) method or a physical vapor deposition (PVD) method. Alternatively, the wiring pattern 64 may be formed by an electroplating method, an electroless plating method, a compressing method, or the like.

Figure 4E:
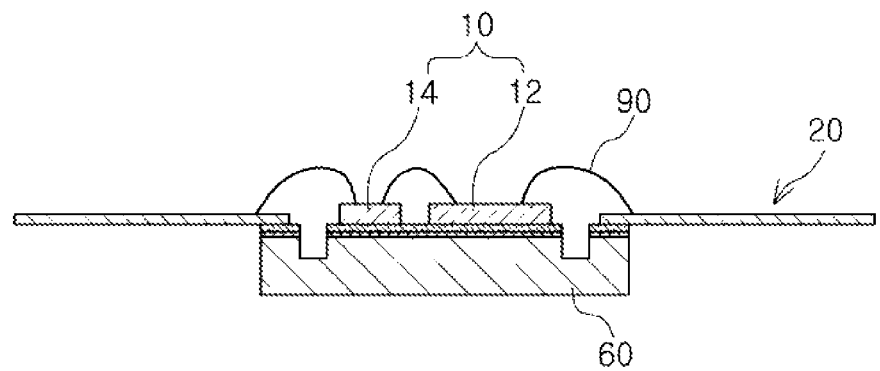

Next, as shown in FIG. 4E, electronic devices 10 and a lead frame 20 may be mounted on the wiring pattern 64. The above-mentioned mounting process may be performed by a conductive adhesive (not shown) such as a solder.

Figure 4F:
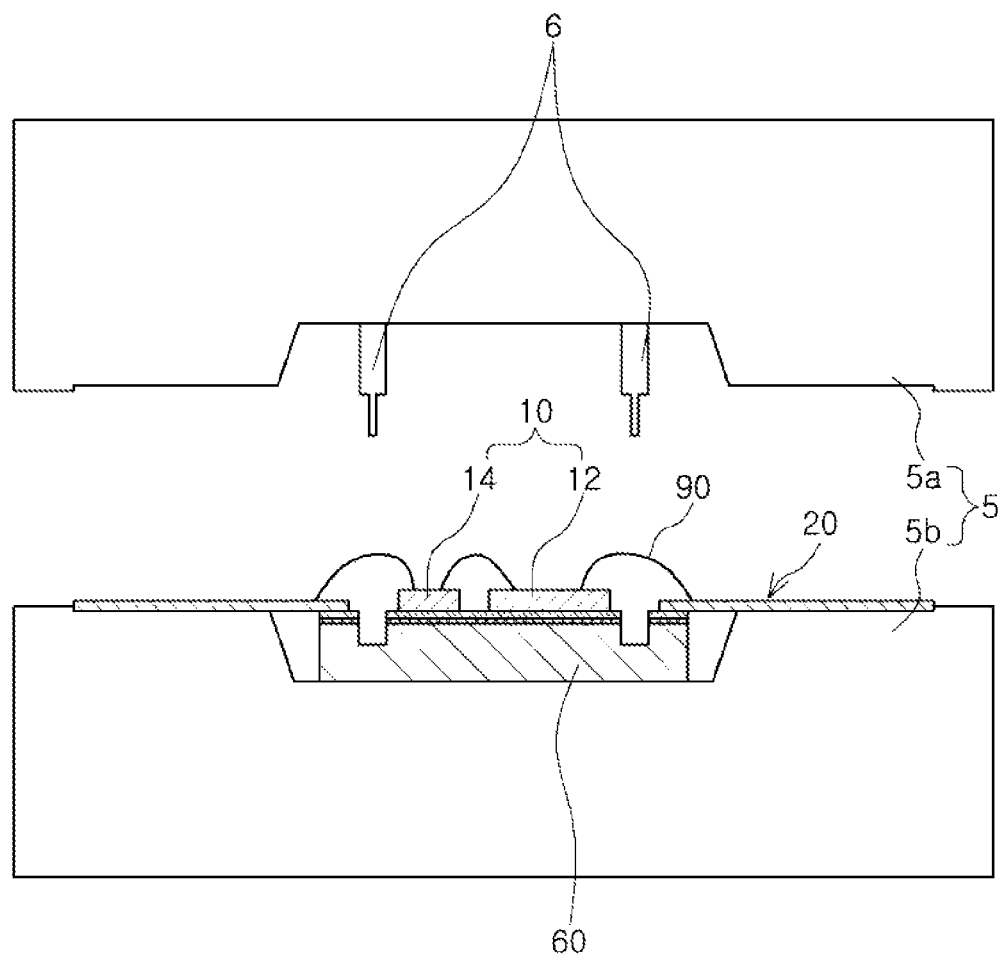

Next, as shown in FIG. 4F, the substrate 60 on which the electronic devices 10 and the lead frame 20 are mounted may be disposed in a mold 5.

Here, the mold 5 may include an upper mold 5a and a lower mold 5b. In addition, at least one of the upper mold 5a and the lower mold 5b may be provided with pressing pins 6.

The pressing pin 6 may be provided to prevent the other surface of the substrate 60 from being spaced apart from the mold 5 or from being bent during a process in which a molding resin is injected to be described below. To this end, the pressing pin 6 according to the present exemplary embodiment may be inserted into the indented portion 60a of the substrate 60 to press the substrate 60.

Therefore, the pressing pin 6 may have an end formed to have a size and a shape which may be easily inserted into the indented portion 60a, and may be formed to have the end having a length capable of pressing a bottom surface of the indented portion 60a at suitable pressure when the upper mold 5a and the lower mold 5b are coupled.

Meanwhile, the pressing pin 6 according to the present exemplary embodiment may be formed in a shape in which a cross sectional area is decreased toward the end thereof. In case of the present exemplary embodiment, the pressing pin 6 may have a step formed therein. Accordingly, an end portion of the pressing pin 6 inserted into the indented portion 60a may have the cross sectional area smaller than that of other portions. However, the configuration of present disclosure is not limited thereto.

In addition, although not illustrated, the pressing pin 6 according to the present exemplary embodiment includes a spring pin or a pogo pin having elastic force, such that it may be configured to press the substrate 60 by elasticity.

Figure 4G:
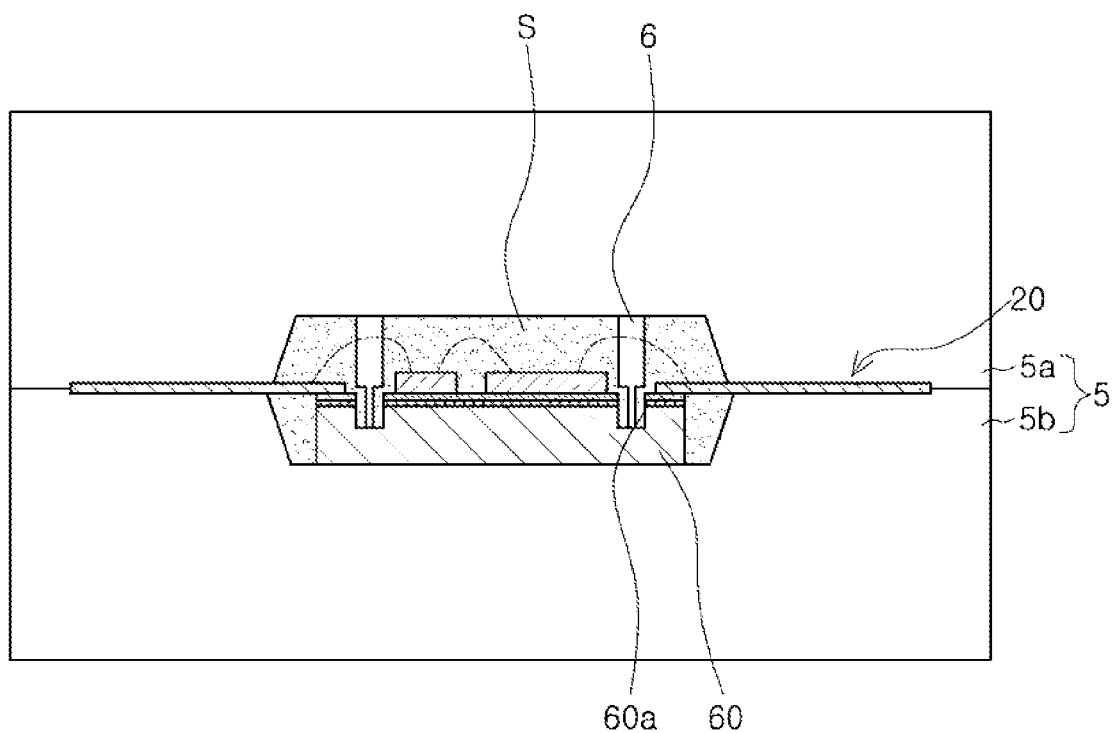

Next, as shown in FIG. 4G, the upper mold 5a and the lower mold 5b may be coupled and the molding resin S may be injected into therebetween.

In the case in which the upper mold 5a and the lower mold 5b are coupled, the end of the pressing pin 6 fastened to the upper mold 5a may be inserted into the indented portion 60a of the substrate 60 and be in contact with the bottom surface of the indented portion 60a, such that the substrate 60 may be downwardly pressed by the pressing pin 6.

Therefore, the other surface, that is, a lower surface of the substrate 60 may be firmly and closely adhered to an inner surface of the lower mold 5b. In this state, since the molding resin S is injected into the mold 5, the molding resin S may not be permeated between one surface of the substrate 60 and the inner surface of the lower mold 5b.

Next, in the case in which the injected molding resin S is cured, the upper mold 5a and the lower mold 5b are separated from each other, the semiconductor package having the molded portion 80 formed therein is taken out of the mold, the lead frame 20 is then bent, such that the semiconductor package 100 as shown in FIG. 3 may be completed. In this case, the semiconductor package 100 may have a through hole 82 formed by the pressing pin 6, such that a portion in which the indented portion 60a is formed may be exposed to the outside by the through hole 82.

In the manufacturing method of the semiconductor package 100 according to the present exemplary embodiment, since the substrate 60 is pressed using the pressing pin 6 during the manufacturing process, a phenomenon that the substrate 60 is bent or deformed may be prevented. In addition, a phenomenon that the molded portion 80 unnecessarily covers the exposed surface of the substrate 60 may be prevented.

Meanwhile, in the case in which the indented portion 60a is not formed in the substrate 60 and the pressing pin 6 directly presses the insulating layer 62 rather than the indented portion 60a, the insulating layer 62 may be damaged by pressure applied by the pressing pin 6. In this case, a short circuit between the wiring pattern 64 and the substrate 60 may occur in the damaged portion, whereby defect of the semiconductor package 100 may be caused.

The above-mentioned problem may be further intensified in the case in which the insulating layer 62 is formed of a ceramic material. Therefore, in the manufacturing method of the semiconductor package 100 according to the present exemplary embodiment, the pressing pin 6 may be in contact with the substrate 60 formed of the metal material rather than the insulating layer 62, and may press only the substrate 60. Therefore, the above-mentioned problems may be solved.

Meanwhile, the semiconductor package according to the present exemplary embodiment is not limited to the above-mentioned embodiment but may be variously applied, as needed.

Figure 5:
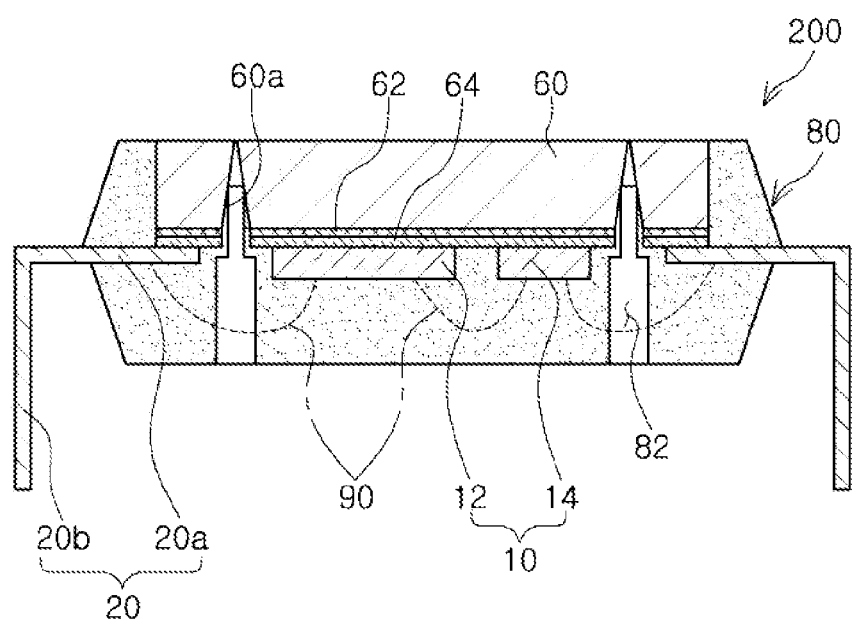
FIG. 5 is a cross-sectional view schematically illustrating a semiconductor package according to another exemplary embodiment in the present disclosure.

FIG. 5 is a cross-sectional view schematically illustrating a semiconductor package according to another exemplary embodiment in the present disclosure.

A semiconductor package 200 according to the present exemplary embodiment illustrates a case in which the indented portion 60a of the substrate 60 is formed in a conical shape, by way of example.

More specifically, the indented portion 60a may be formed in a shape of the through hole 82 rather than a shape of the groove, and may be formed in a shape in which an cross sectional area thereof is decreased toward the other surface, that is, the exposed surface of the substrate 60. However, the indented portion 60a is not limited to the above-mentioned forms, but may be variously deformed. For example, the indented portion 60a may be configured in the shape of groove.

Meanwhile, FIG. 5 illustrates a case in which the pressing pin 6 illustrated in FIG. 4F as described above is used. However, the indented portion 60a is not limited thereto, but a shape of the pressing pin may also be variously deformed to correspond to a shape of the indented portion 60a according to the present exemplary embodiment.

Figure 6:
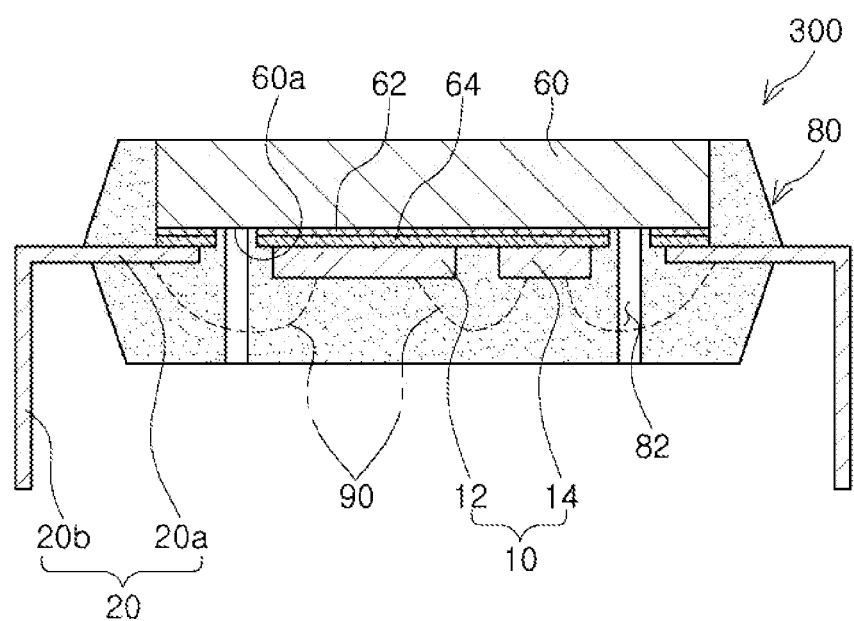
FIG. 6 is a cross-sectional view schematically illustrating a semiconductor package according to another exemplary embodiment in the present disclosure.

FIG. 6 is a cross-sectional view schematically illustrating a semiconductor package according to another exemplary embodiment in the present disclosure.

In a semiconductor package 300 according to the present exemplary embodiment, the indented portion 60a may not be formed in a shape of groove and may be defined as one portion of one surface of the substrate 60. In addition, a portion corresponding to the indented portion 60a is removed from only the insulating layer 62, such that one surface corresponding to the indented portion 60a of the substrate 60 may be partially exposed.

Therefore, the pressing pin of the mold penetrates through the insulating layer 62 during the manufacturing process, whereby it may press the one surface of the substrate 60.

In this case, an effect associated with a function preventing the substrate 60 from being delaminated from the molded portion 80 may be less than that of the above-mentioned exemplary embodiments. However, since the groove is not formed in the substrate 60, the semiconductor package 300 may be easily manufactured.

As set forth above, according to exemplary embodiments of the present disclosure, the semiconductor package expands the exposed area of the substrate exposed to the outside by the indented portion formed in the substrate, whereby the heat dissipating effect may be increased. In addition, since the molded portion is partially filled in the indented portion formed in the substrate, the substrate and the molded portion may be very firmly coupled. Therefore, even in the case in which much heat is generated due to the operation of the semiconductor package, a phenomenon that the substrate and the molded portion are delaminated from each other due to heat deformation may be prevented.

In addition, in the manufacturing method of the semiconductor package according to an exemplary embodiment of the present, since the substrate is pressed using the pressing pin during the manufacturing process, a phenomenon that the substrate is bent or deformed may be prevented. In addition, a phenomenon that the molded portion unnecessarily covers the exposed surface of the substrate may be prevented.

While exemplary embodiments have been shown and described above, it will be apparent to those skilled in the art that modifications and variations could be made without departing from the scope of the present invention as defined by the appended claims.

What is claimed is:

1. A semiconductor package comprising:
    a substrate having at least one indented portion formed as a groove therein;
    at least one electronic device mounted on one surface of the substrate;
    a lead frame bonded to the substrate and electrically connected to the electronic device; and
    a molded portion sealing the lead frame and the electronic device and including at least one through hole extending the indented portion,
    wherein an interior of the indented portion is partially exposed to air through the through hole.

2. The semiconductor package of claim 1, wherein the substrate has the indented portion formed in one surface thereof and the other surface exposed to an exterior of the molded portion.

3. The semiconductor package of claim 1, further comprising an insulating layer interposed between the substrate and the electronic device.

4. The semiconductor package of claim 3, wherein the insulating layer is formed of a ceramic material.

5. The semiconductor package of claim 1, wherein the indented portion is formed in a thickness direction of the substrate.

6. The semiconductor package of claim 1, wherein the indented portion is formed as a groove having the same cross sectional area.

7. The semiconductor package of claim 1, wherein the indented portion is formed as a groove having a cross sectional area decreased toward one end thereof.

8. The semiconductor package of claim 1, wherein the molded portion is partially formed in the indented portion.

9. A semiconductor package comprising:
    a substrate having at least one indented portion formed as a groove in one surface thereof;
    an insulating layer stacked on one surface of the substrate;
    a wiring pattern formed on the insulating layer;
    at least one electronic device mounted on the wiring pattern; and
    a molded portion sealing the electronic device and including at least one through hole exposing the indented portion to the outside,
    wherein an interior of the indented portion is partially exposed to air through the through hole.

10. A manufacturing method of a semiconductor package, the method comprising:
    preparing a substrate;
    forming an indented portion in a groove shape in one surface of the substrate;
    mounting an electronic device on one surface of the substrate; and
    pressing the indented portion in a mold and forming a molded portion such that an interior of the indented portion is partially exposed to air.

11. The manufacturing method of claim 10, wherein the forming of the molded portion includes:
    allowing a pressing pin included in the mold to be in contact with the indented portion and pressing the substrate; and
    injecting a molding resin into the mold.

12. The manufacturing method of claim 10, wherein the forming of the indented portion includes:
    forming an insulating layer on one surface of the substrate; and
    forming a wiring pattern on the insulating layer.

13. The manufacturing method of claim 12, wherein in the forming of the insulating layer, the insulating layer is formed of a ceramic material.

14. The manufacturing method of claim 12, wherein in the forming of the molded portion, the molded portion is partially formed in the indented portion formed in the groove shape.

* * * * *